United States Patent
Dhindsa et al.

(10) Patent No.: US 7,683,289 B2
(45) Date of Patent: Mar. 23, 2010

(54) APPARATUS AND METHOD FOR CONTROLLING PLASMA DENSITY PROFILE

(75) Inventors: Rajinder Dhindsa, San Jose, CA (US); Felix Kozakevich, Sunnyvale, CA (US); Lumin Li, Santa Clara, CA (US); Dave Trussell, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1118 days.

(21) Appl. No.: 11/303,729

(22) Filed: Dec. 16, 2005

(65) Prior Publication Data

US 2007/0141729 A1   Jun. 21, 2007

(51) Int. Cl.
*B23K 10/00* (2006.01)
*C23C 16/00* (2006.01)
*H01L 21/306* (2006.01)

(52) U.S. Cl. ............... 219/121.43; 219/121.41; 118/723 I; 118/723 R; 204/298.32; 156/345.44; 156/345.48; 315/111.21

(58) Field of Classification Search ............ 219/121.43, 219/121.41; 204/298.38, 298.39, 289.32; 156/345.36, 345.41, 345.44, 345.47, 345.48; 315/111.21; 438/7, 9, 10; 118/723.1, 723 MW; 216/67, 69
See application file for complete search history.

(56) References Cited

U.S. PATENT DOCUMENTS

| | | | | |
|---|---|---|---|---|
| 5,998,932 A | * | 12/1999 | Lenz | 315/111.21 |
| 6,259,334 B1 | * | 7/2001 | Howald | 333/17.3 |
| 6,962,664 B2 | | 11/2005 | Mitrovic | |
| 2003/0148611 A1 | * | 8/2003 | Dhindsa et al. | 438/689 |
| 2003/0201069 A1 | * | 10/2003 | Johnson | 156/345.43 |
| 2004/0112536 A1 | * | 6/2004 | Quon | 156/345.28 |
| 2004/0222189 A1 | * | 11/2004 | Fischer | 216/67 |
| 2005/0039682 A1 | * | 2/2005 | Dhindsa et al. | 118/723 E |
| 2006/0118044 A1 | * | 6/2006 | Himori et al. | 118/723 E |
| 2006/0118518 A1 | * | 6/2006 | Rusu et al. | 216/67 |

* cited by examiner

*Primary Examiner*—Stephen J Ralis
(74) *Attorney, Agent, or Firm*—Martine Penilla & Gencarella, LLP

(57) ABSTRACT

A number of RF power transmission paths are defined to extend from an RF power source through a matching network, through a transmit electrode, through a plasma to a number of return electrodes. A number of tuning elements are respectively disposed within the number of RF power transmission paths. Each tuning element is defined to adjust an amount of RF power to be transmitted through the RF power transmission path within which the tuning element is disposed. A plasma density within a vicinity of a particular RF power transmission path is directly proportional to the amount of RF power transmitted through the particular RF power transmission path. Therefore, adjustment of RF power transmitted through the RF power transmission paths, as afforded by the tuning element, enables control of a plasma density profile across a substrate.

12 Claims, 7 Drawing Sheets

APPARATUS AND METHOD FOR CONTROLLING PLASMA DENSITY PROFILE

BACKGROUND

Semiconductor wafer ("wafer") fabrication often includes exposing a wafer to a plasma to allow the reactive constituents of the plasma to modify the surface of the wafer, e.g., remove material from unprotected areas of the wafer surface. The wafer characteristics resulting from the plasma fabrication process are dependent on the process conditions, including the plasma density profile across the wafer surface. It should be appreciated that differences in plasma density profile during processing of different wafers will result in different wafer surface characteristics. Thus, a drift in process results between different wafers can be caused by variations in the plasma density profile. Additionally, because an amount of reaction between the plasma and a particular portion of the wafer surface is directly proportional to the plasma density over the particular portion of the wafer surface, variations in the plasma density profile can result in center-to-edge wafer uniformity problems. Such center-to-edge wafer uniformity problems can adversely effect a die yield per wafer.

Some objectives in wafer fabrication include optimizing a die yield per wafer and fabricating each wafer of a common type in as identical a manner as possible. To meet these objectives, it is desirable to control the uniformity of features across an individual wafer and among various wafers of a common type. Previous plasma processing techniques have attempted to control wafer uniformity in an indirect manner by compensating for an uncontrolled plasma density profile overlying the wafer surface. Such compensation has been provided through control of various process parameters, such as reactant gas flow and wafer temperature, that influence reactions between the plasma and the wafer, but do not directly control the plasma density profile overlying the wafer surface. A solution is needed to enable more direct control of the plasma density profile overlying the wafer surface such that wafer uniformity can be controlled in a more direct manner.

SUMMARY

In one embodiment, a plasma processing system for semiconductor wafer processing is disclosed. The system includes a radiofrequency (RF) power source and a matching network connected to the RF power source. A transmit electrode is connected to the matching network and is defined to transmit RF power to a plasma to be generated within a volume. A number of RF power transmission paths extend from the RF power source through the matching network, through the transmit electrode, through the plasma to a number of return electrodes. The system also includes a number of tuning elements respectively disposed within the number of RF power transmission paths. Each of the number of tuning elements is defined to adjust an amount of RF power to be transmitted through the RF power transmission path within which the tuning element is disposed. A plasma density within a vicinity of a particular RF power transmission path is directly proportional to the amount of RF power transmitted through the particular RF power transmission path during operation of the plasma processing system.

In another embodiment, a method is disclosed for controlling a plasma density profile relative to a substrate. The method includes applying RF power to a reactant gas to generate a plasma over a top surface of a substrate. The method also includes controlling an amount of RF power transmitted through each of a number of RF power transmission paths. The RF power transmission paths are spatially dispersed throughout the plasma relative to the top surface of the substrate. Controlling the amount of RF power transmitted through a particular RF power transmission path causes a plasma density within a vicinity of the particular RF power transmission path to be proportionally controlled.

In another embodiment, a system for controlling a plasma density profile relative to a substrate is disclosed. The system includes a plasma processing chamber within which RF power is to be applied to a reactant gas to generate a plasma over a top surface of a substrate. The system also includes an RF power source for generating the RF power. A matching network is also provided for matching an impedance of the RF power to be supplied to the plasma processing chamber. Within the system, a number of RF power transmission paths extend from the RF power source through the matching network, through a transmit electrode, through the plasma to a number of return electrodes. The amount of RF power transmitted along a particular RF power transmission path directly influences a plasma density within a vicinity of the particular RF power transmission path. The system further includes a number of RF power tuning elements respectively disposed within the number of RF power transmission paths. Each RF power tuning element is capable of adjusting an amount of RF power transmitted along the RF power transmission path within which the tuning element is disposed. Additionally, the system includes a computing system defined to receive plasma density profile monitoring signals from the plasma chamber. The computing system is further defined to generate and transmit control signals to the RF power tuning elements to adjust the plasma density within the vicinity of each RF power transmission path. The computing system controls the RF power tuning elements such that a plasma density profile over the top surface of the substrate is maintained in accordance with a target plasma density profile.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
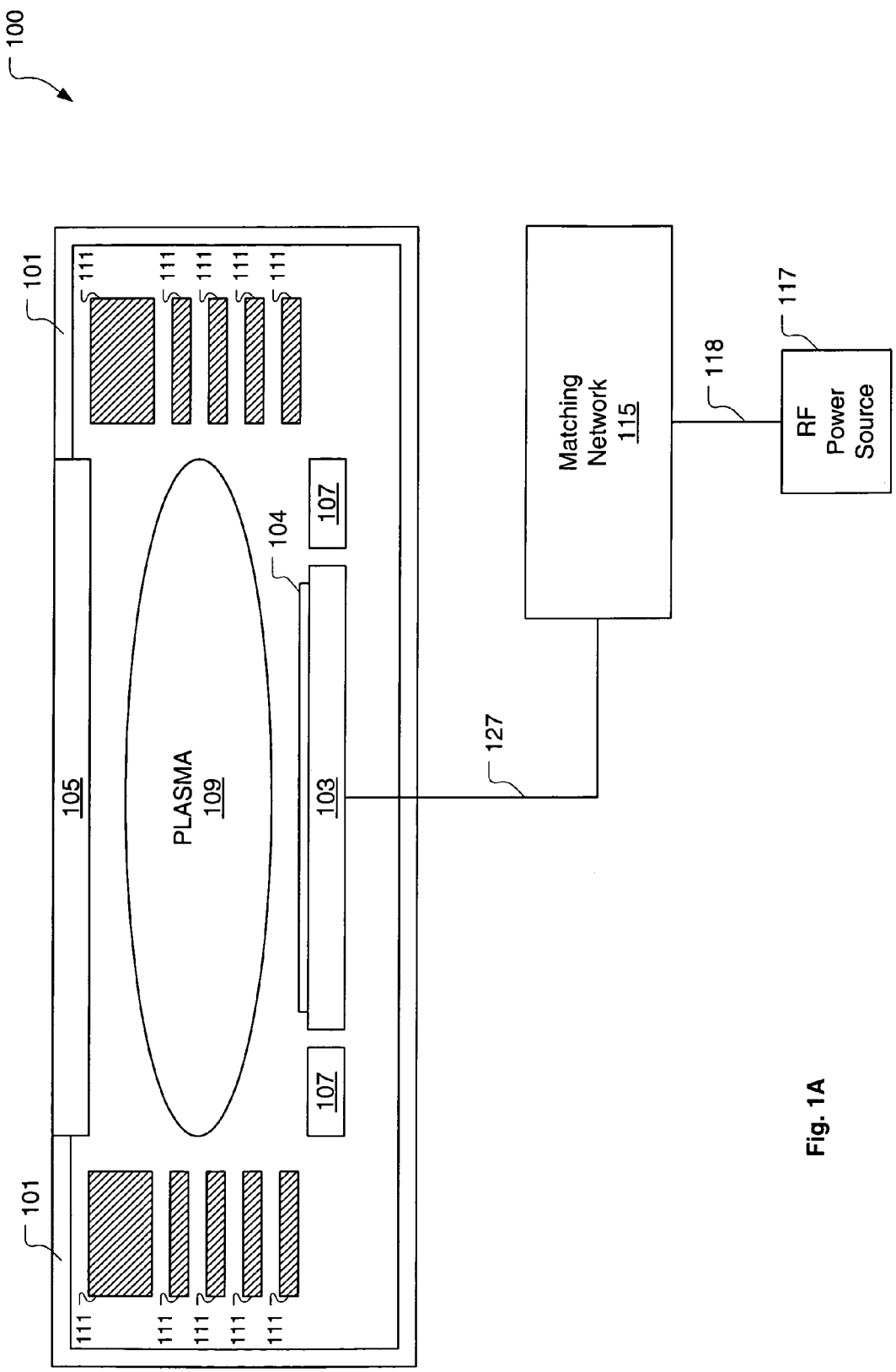
FIG. 1A is an illustration showing a plasma processing system for semiconductor wafer processing, in accordance with one embodiment of the present invention.

FIG. 1A is an illustration showing a plasma processing system 100 for semiconductor wafer processing, in accordance with one embodiment of the present invention. The system 100 includes a plasma processing chamber ("chamber") 101 within which a plasma 109 can be generated in exposure to a substrate 104. It should be understood that the substrate 104 can represent a semiconductor wafer or any other type of substrate within which electronic elements are to be defined. The chamber 101 includes a lower electrode 103 and an upper electrode 105. During operation, radiofrequency (RF) power is generated by an RF power source 117 and transmitted through a matching network 115 to the lower electrode 103, via connections 118 and 127. It should be appreciated that the matching network 115 is defined to provide appropriate impedance matching to ensure that the RF power is properly transmitted from the source 117 to a load. The RF power received at the lower electrode 103 is transmitted through the chamber 101 volume to the upper electrode 105, which is grounded, and to ground extensions 107 located outside a periphery of the lower electrode 103.

During operation, a reactant gas is supplied to the chamber 101 volume in a controlled manner. The RF power transmitted from the lower electrode 103 through the chamber 101 volume, i.e., through the reactant gas, to the upper electrode 105 and ground extensions 107 serves to transform the reactant gas into the plasma 109. A density of the plasma 109 at a particular location within chamber 101 is directly proportional to an amount of RF power being transmitted through the particular location within the chamber 101. Therefore, increased RF power transmission through a particular location within the chamber 101 will result in an increased plasma 109 density at the particular location within the chamber 101, vice-versa. A set of confinement rings 111 are positioned within the chamber 101 to surround a volume overlying the substrate 104 between the lower and upper electrodes 103/105. The confinement rings 111 serve to confine the plasma 109 to the volume overlying the substrate 104. Additionally, some embodiments provide for controlled movement of the confinement rings 111 during operation to enable adjustment of reactant gas flow between the various confinement rings 111 in a direction toward or away from the volume overlying the substrate 104.

It should be appreciated that the plasma processing chamber 101 and system 100 includes many other features and components that are not described herein to avoid unnecessarily obscuring the present invention. The present invention is primarily concerned with controlling a spatial variation of the plasma 109 density within the chamber 101 by controlling RF power transmission paths through the chamber 101. Through control of the spatial variation of the plasma 109 density within the chamber 101, a spatial variation of an amount of reaction between the plasma 109 and the substrate 104 can be controlled. More specifically, by controlling the plasma 109 density to be increased over a particular area of the substrate 104, the amount of reaction between the plasma 109 and the particular area of the substrate 104 will be increased, vice-versa. Furthermore, because the uniformity of features defined across the substrate 104, i.e., the uniformity of plasma processing results across the substrate 104, is dependent upon the amount of plasma-to-substrate reaction as a function of location on the substrate 104 surface, the uniformity of features defined across the substrate 104 can be directly controlled by controlling the spatial variation of the plasma 109 density over the substrate 104. Therefore, by controlling the RF power transmission paths through the chamber 101, the uniformity of features defined across the substrate 104 can be directly controlled.

Figure 1B:
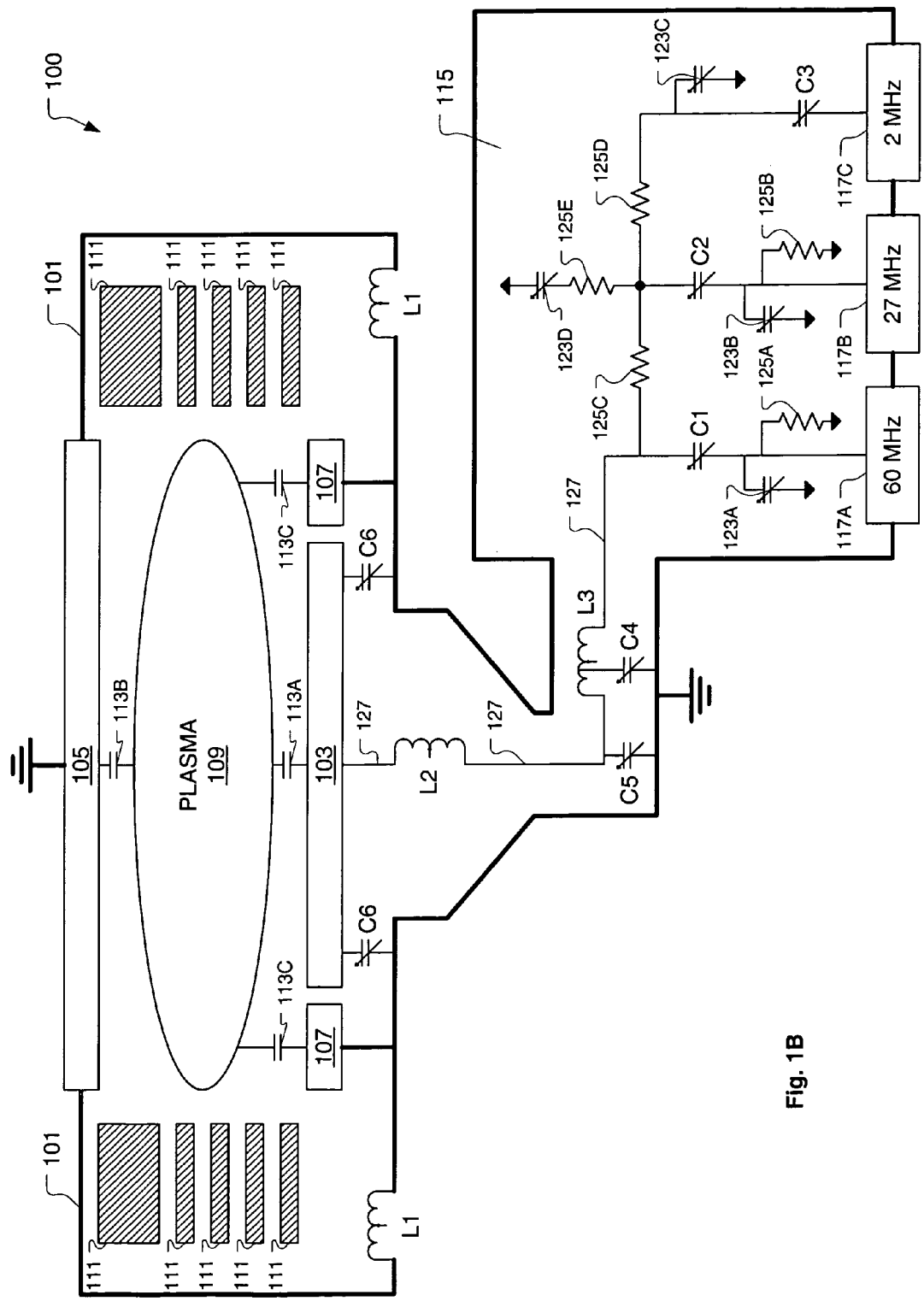
FIG. 1B is an illustration showing the RF power generation and transmission components of the plasma processing system, in accordance with one embodiment of the present invention.

FIG. 1B is an illustration showing the RF power generation and transmission components of the plasma processing system 100, in accordance with one embodiment of the present invention. As described with respect to FIG. 1A, the plasma processing system 100 includes the chamber 101, the lower electrode 103, the upper electrode 105, the ground extensions 107, and the confinement rings 111. For ease of illustration, the substrate 104 is not shown in FIG. 1B. However, with respect to FIG. 1B and the remaining description provided herein, it should be understood that the substrate 104 is supported on the lower electrode 103 in exposure to the plasma 109 during the plasma process.

In the embodiment of FIG. 1B, the RF power source 117 is represented by three separate RF power sources 117A-117C, that are defined to generate RF power at a frequency of 60 MHz, 27 MHz, and 2 MHz, respectively. It should be appreciated that in other embodiments, the RF power source 117 can be defined to generate RF power at either a different number of frequencies or at different frequency values than what are presented in the exemplary embodiment of FIG. 1B. Also, it should be appreciated that during operation, the various RF power sources 117A-117C can be operated in any combination, depending on what is necessary to satisfy process requirements. Additionally, either of the RF power sources 117A-117C can be turned off during a particular plasma process.

The RF power generated by the RF power sources 117A-117C is transmitted through the matching network 115 to the lower electrode 103, via connection 127. The matching network 115 includes a number of resistive elements 125A-125E and capacitive elements 123A-123D that can each be adjusted to provide a required impedance matching for transmission of a particular RF power source. The RF transmission path extending from the RF power source 117A to the connection 127 also includes an adjustable capacitive element C1. The RF transmission path extending from the RF power source 117B to the connection 127 also includes an adjustable capacitive element C2. The RF transmission path extending from the RF power source 117C to the connection 127 also includes an adjustable capacitive element C3. Additionally, the RF transmission path extending from the matching network 115 to the lower electrode 103, i.e., along the connection 127, includes adjustable inductive elements L2 and L3. Adjustable capacitive elements C4 and C5 are also connected between the RF transmission path extending from the matching network 115 to the lower electrode 103 and a ground potential.

The RF power arriving at the lower electrode 103 from the RF power sources 117A-117C is transmitted from the lower electrode 103 through the chamber volume to one or more grounded components within the chamber, such as the upper electrode 105 or the ground extensions 107. Thus, the lower electrode 103 is defined as a transmit electrode and the grounded components, i.e., upper electrode 105 and ground extensions 107, are defined as return electrodes. As the RF power is transmitted through the reactant gas, the plasma 109 is generated. The plasma 109 is capacitively coupled to the lower electrode 103, the upper electrode 105, and the ground extensions, as illustrated by capacitances 113A-113C, respectively. In operation, a ground circuit is defined from the chamber 101 walls to a reference ground potential. In one embodiment, an adjustable inductance L1 is provided within the ground circuit extending from the chamber 101 walls to the reference ground potential. Also, in one embodiment, an adjustable capacitance C6 is established between the lower electrode 103 and the above-mentioned ground circuit. It should be appreciated that because RF power is being transmitted, the various adjustable inductive elements L1, L2, L3, and the various adjustable capacitive elements C1, C2, C3, C4, C5, C6 are defined by components which provide a corresponding inductive or capacitive effect within the RF domain.

During operation, the various adjustable inductive elements L1, L2, L3, and the various adjustable capacitive elements C1, C2, C3, C4, C5, C6 can be set to control a transmission path of the RF power through the chamber 101 internal volume. The various adjustable inductive elements L1, L2, L3, and the various adjustable capacitive elements C1, C2, C3, C4, C5, C6 are collectively referred to as tuning elements. During operation, each tuning element can be controlled to control an amount of RF power transmitted through the RF power transmission path within which the tuning element is disposed. Therefore, because the local plasma density is directly proportional to the local RF power being transmitted, the various tuning elements can be used to manipulate a plasma density profile relative to the substrate. More specifically, the various tuning elements can be used to locally increase or decrease the plasma density overlying the substrate at various locations along a direction extending from the center of the substrate to the edge of the substrate. Such manipulation of the plasma density profile also influences a shape of the plasma overlying the substrate. Furthermore, such manipulation of the plasma density profile directly effects the amount of plasma-to-substrate reaction at various radial locations extending from the center of the substrate to the edge of the substrate, and hence effects the resulting uniformity of the substrate.

Figure 2A:
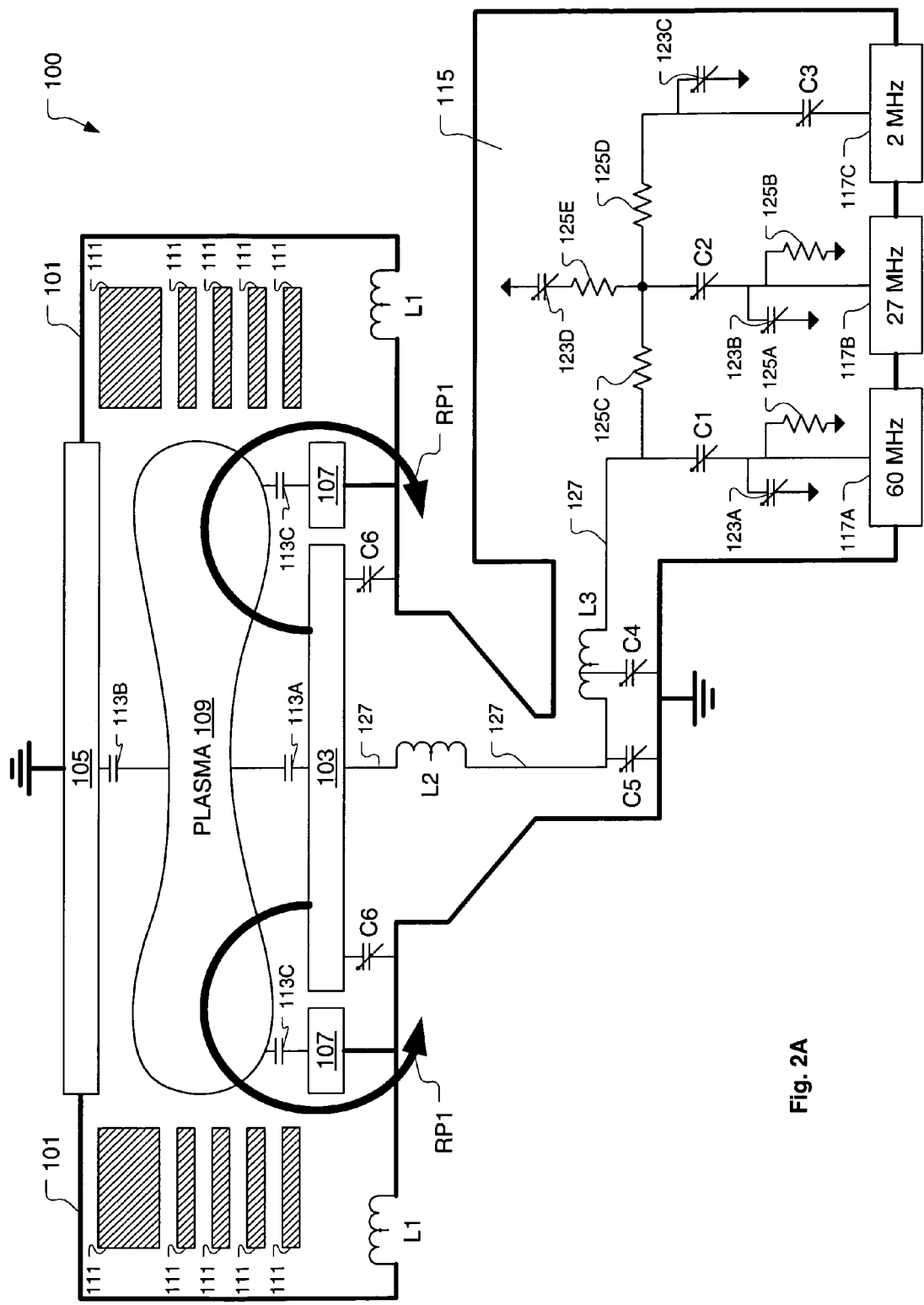
FIG. 2A is an illustration showing the RF power transmission paths being controlled to provide a radially increasing plasma density profile, in accordance with one exemplary embodiment of the present invention.

FIG. 2A is an illustration showing the RF power transmission paths being controlled to provide a radially increasing plasma density profile, in accordance with one exemplary embodiment of the present invention. In the example embodiment of FIG. 2A, the RF power transmission paths (RP1) extending from the lower electrode 103 (transmit electrode) to the ground extensions 107 (return electrodes) are controlled to transmit more RF power than what is transmitted along other RF transmission paths extending from lower electrode 103 to the upper electrode 105. Therefore, the increased RF power transmitted along the RF power transmission paths (RP1) cause the plasma density overlying and toward a periphery of the lower electrode 103, to be greater than the plasma density overlying and toward the center of the lower electrode 103. Consequently, there will be more plasma-to-substrate reaction at outer regions of the substrate relative to inner regions of the substrate.

Figure 2B:
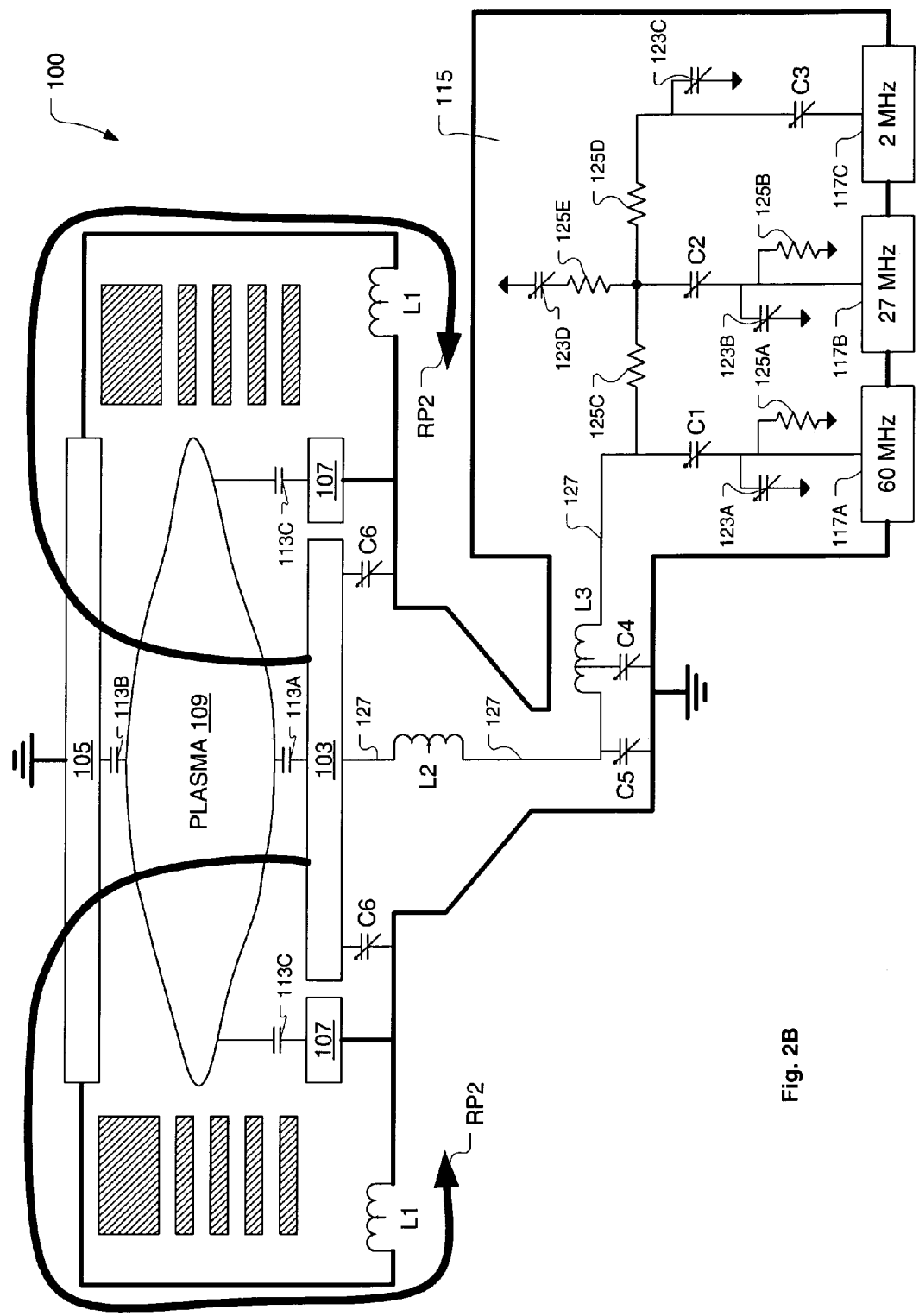
FIG. 2B is an illustration showing the RF power transmission paths being controlled to provide a radially decreasing plasma density profile, in accordance with one exemplary embodiment of the present invention.

FIG. 2B is an illustration showing the RF power transmission paths being controlled to provide a radially decreasing plasma density profile, in accordance with one exemplary embodiment of the present invention. In the example embodiment of FIG. 2B, the RF power transmission paths (RP2) extending from the lower electrode 103 (transmit electrode) to the upper electrode 105 (return electrode) are controlled to transmit more RF power than what is transmitted along other RF transmission paths extending from lower electrode 103 to the ground extensions 107. Therefore, the increased RF power transmitted along the RF power transmission paths (RP2) cause the plasma density overlying and toward the center of the lower electrode 103, to be greater than the plasma density overlying and toward the periphery of the lower electrode 103. Consequently, there will be more plasma-to-substrate reaction at inner regions of the substrate relative to outer regions of the substrate.

It should be understood that the RF power transmission path control depicted in FIGS. 2A and 2B represent simplified extremes of how the plasma density profile can be manipulated through the present invention. Furthermore, it should be appreciated that the tuning elements within the various RF transmission paths, as afforded by the present invention, can be controlled to manipulate the plasma density profile relative to the substrate in essentially any conceivable manner. To enhance flexibility with respect to how the plasma density profile can be manipulated, the various return electrodes are positioned with respect to the transmit electrode about the volume within which the plasma is generated such that various RF power transmission paths are spatially distributed relative to the transmit electrode, and hence relative to the substrate supported by the transmit electrode.

As described in more detail below with respect to FIG. 3, the plasma processing system 100 of FIGS. 1A-2B can further include a control system defined to control the various tuning elements, thus enabling control of RF power transmission through the spatially distributed RF power transmission paths. In one embodiment, the RF power transmission paths can be controlled such that a target plasma density profile is established relative to the transmit electrode. Additionally, one or more control signals indicative of the existing plasma density profile can be used to determine tuning element adjustments necessary to maintain the target plasma density profile within the chamber. In one embodiment, the control signals are acquired and transmitted by appropriately defined metrology disposed at numerous spatially dispersed locations through the volume in which the plasma is generated.

Figure 3:
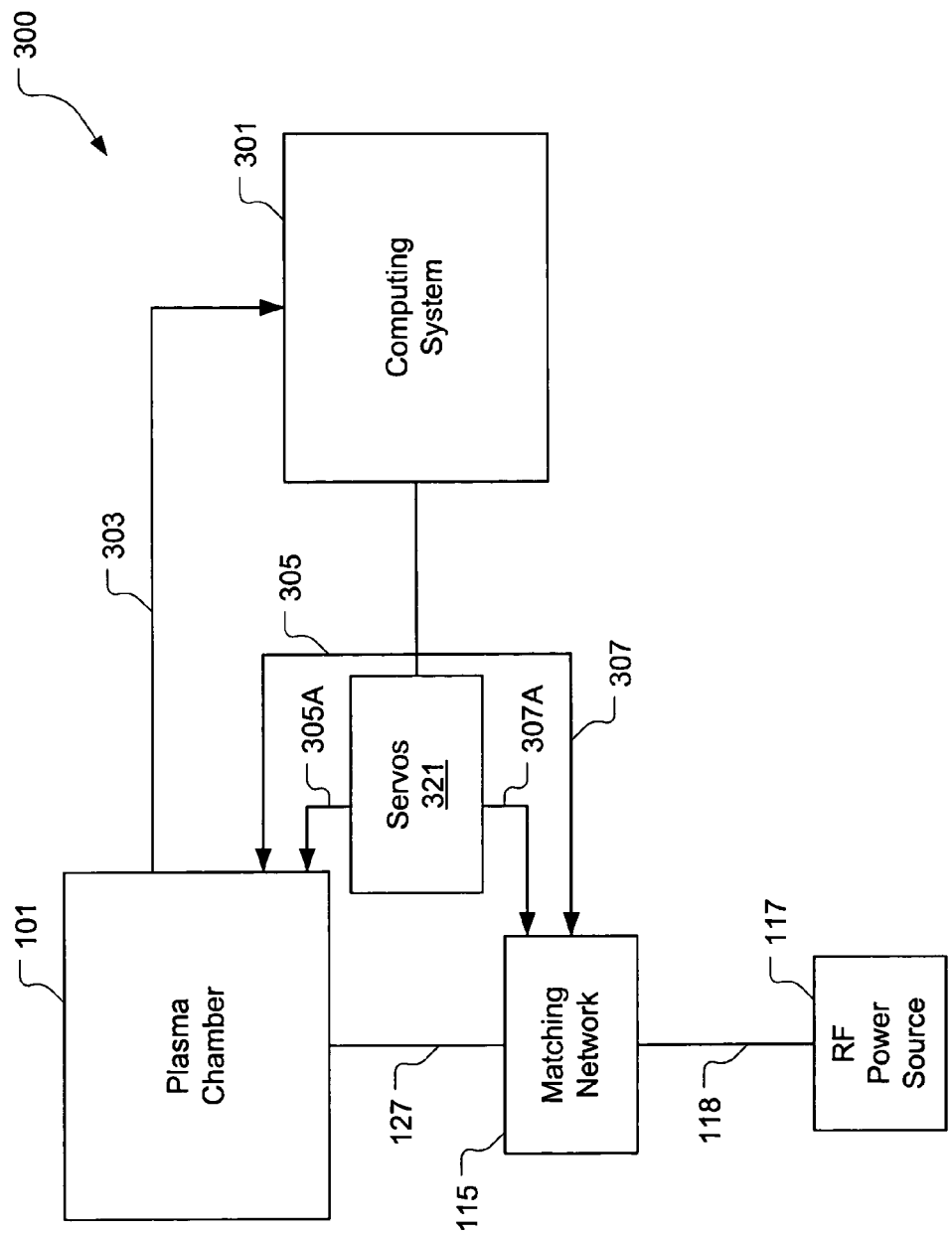
FIG. 3 is an illustration showing a system for controlling a plasma density profile relative to a substrate, in accordance with one embodiment of the present invention.

FIG. 3 is an illustration showing a system 300 for controlling a plasma density profile relative to a substrate, in accordance with one embodiment of the present invention. The system 300 includes the plasma chamber 101, the matching network 115, and the RF power source 117, as previously described with respect to FIGS. 1A-2B. As previously described, a number of RF power transmission paths extend from the RF power source 117 through the matching network 115, through the transmit electrode within the chamber 101, through the plasma within the chamber 101, to a number of spatially dispersed return electrodes within the chamber 101. The amount of RF power transmitted along a particular RF power transmission path directly influences a plasma density within a vicinity of the particular RF power transmission path. Also, a number of RF power tuning elements are respectively disposed within the number of RF power transmission paths. Each of the tuning elements are capable of being manipulated to adjust an amount of RF power transmitted along the RF power transmission path within which the tuning element is disposed.

Additionally, the system 300 includes a computing system 301 defined to receive plasma density monitoring signals from the plasma chamber 101, as indicated by arrow 303. The computing system is defined to generate and transmit control signals to the various tuning elements along the different RF power transmission paths. as indicated by arrows 305 and 307. The control signals serve to control the various tuning elements (adjustable capacitive elements C1, C2, C3, C4, C5, C6, and/or adjustable inductive elements L1. L2, L3) such that plasma densities within the vicinity of the corresponding RF power transmission paths are adjusted to maintain the plasma density profile overlying the substrate in accordance with a target plasma density profile stored in the computing system 301.

In one embodiment, metrology is provided for directly measuring the plasma density at various spatially dispersed locations over the top surface of the substrate. These directly measured plasma densities represent the monitoring signals provided from the chamber 101 to the computing system 301. In another embodiment, metrology is provided for measuring the bias voltage at various dispersed locations across the top surface of the substrate. These measured bias voltages represent the monitoring signals provided from the chamber 101 to the computing system 301. The computing system 301 includes a correlation between measured bias voltage on the substrate and plasma density over the substrate. The computing system 301 is defined to use the received measured bias voltages and correlation to determine an existing plasma density profile over the top surface of the substrate. For example, in one embodiment, a required bias voltage profile across the substrate corresponding to a target plasma density profile is provided as input to the computing system 301. The computing system 301 monitors the bias voltage on the substrate to determine if the required bias voltage profile is present on the substrate. The computing system 301 transmits appropriate tuning element control signals to adjust the RF power transmission paths as necessary to match the measured bias voltage profile on the substrate to the required bias profile. If the required bias voltage profile is maintained across the substrate, the plasma density profile overlying the substrate will correspond to the target plasma density profile.

As previously mentioned, the various tuning elements within the RF power transmission paths can be either adjustable capacitive elements or adjustable inductive elements. Those skilled in the art will appreciate that capacitive and inductive effects in transmission of RF power can be provided by physical structures within the RF transmission channels. Thus, manipulation of these physical structures within the RF transmission channels can be used to manipulate the corresponding capacitive or inductive effects provided by the physical structures. In one embodiment, the tuning element control signals generated and transmitted by the computing system 301 are routed to servos 321 that are defined to mechanically adjust the physical structures defining the adjustable capacitive elements (C1, C2, C3, C4, C5, C6) or adjustable inductive elements (L1, L2, L3) within the various RE transmission paths as appropriates, as indicated by arrows 305A and 307A.

To demonstrate the operability of the present invention, an example plasma process was performed in which the adjustable capacitive element C1 of FIG. 1B was varied while the other tuning elements were maintained at a substantially constant value. It should be understood that the particular process and tuning element settings used this example plasma process were selected for demonstration purposes only. In actual practice, the present invention can be used within an essentially unlimited process window, wherein various process parameters, e.g., pressure, gas mixture, gas flow rates, bias, tuning element settings, etc., can be set at any value appropriate for the particular plasma process that is being performed. Also, it should also be appreciated that in actual practice the results of the plasma process, e.g., etch rates, uniformity, etc., as a function of various tuning element settings will be dependent upon the integral effect of other process parameter settings.

Figure 4:
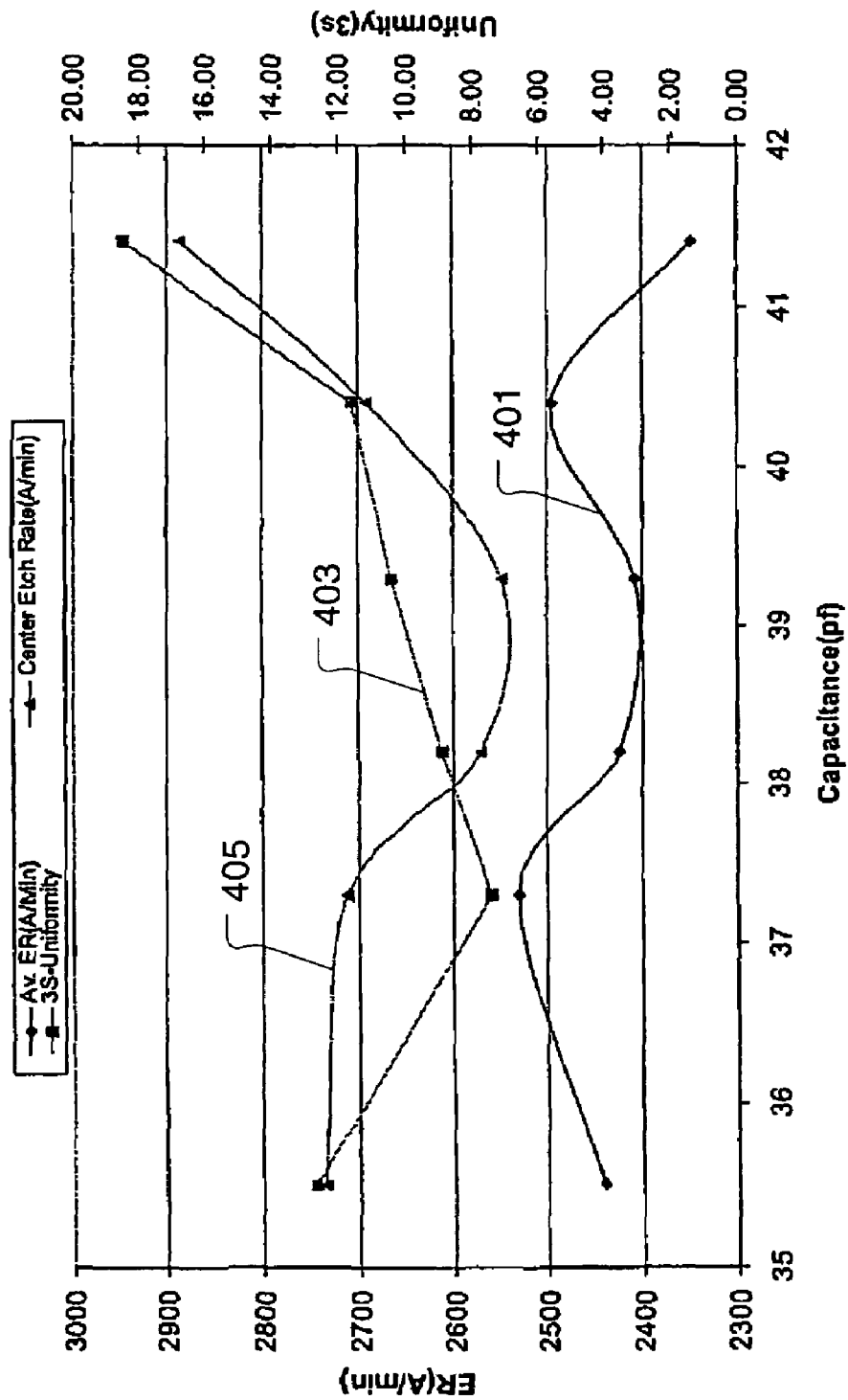
FIG. 4 is an illustration showing the results of the example plasma process as a function of the adjustable capacitive element C1 setting.

Table 1 presents various process parameter and tuning element settings applied during the example plasma process. In Table 1, the various tuning elements are identified by their respective reference number as previously presented in FIG. 1B. During the example plasma process, the impedance matching capacitors 123A-123D and resistors 125A-125E are set to provide an appropriate impedance match so that the generated RF power can be successfully transmitted through the plasma without adverse reflection and interference. FIG. 4 is an illustration showing the results of the example plasma process as a function of the adjustable capacitive element C1 setting. In FIG. 4, the average etch rate across the test wafer is shown by curve 401. The three-sigma uniformity across the test wafer is shown by curve 403. The etch rate at the center of the test wafer is shown by curve 405. Based on the variation in average etch rate, uniformity, and center etch rate as a function of the tuning element (C1) capacitance, it should be appreciated that the tuning element (C1) can be adjusted to influence the etch rate results across the wafer. Therefore, the example plasma process demonstrates how the plasma density profile can be controlled by adjusting particular tuning elements such that the amount of RF power transmitted through corresponding RF power transmission paths is controlled.

TABLE 1

Example Plasma Process Settings

| Process Parameter/<br>Tuning Element | Setting |
|---|---|
| Pressure | 80 mT |
| Gas Mixture | Ar at 300 scc/min, $CF_4$ at 120 scc/min, $CHF_3$ at 40 scc/min, $O_2$ at 15 scc/min |
| Bias Voltage | 220 V |
| Tuning Element (C1) | VARIABLE |
| Tuning Element (C2) | 120 pF |
| Tuning Element (C3) | 350 pF |
| Tuning Elements (C4 + C5) | 56 pF |
| Tuning Element (C6) | 220 pF |

Figure 5:
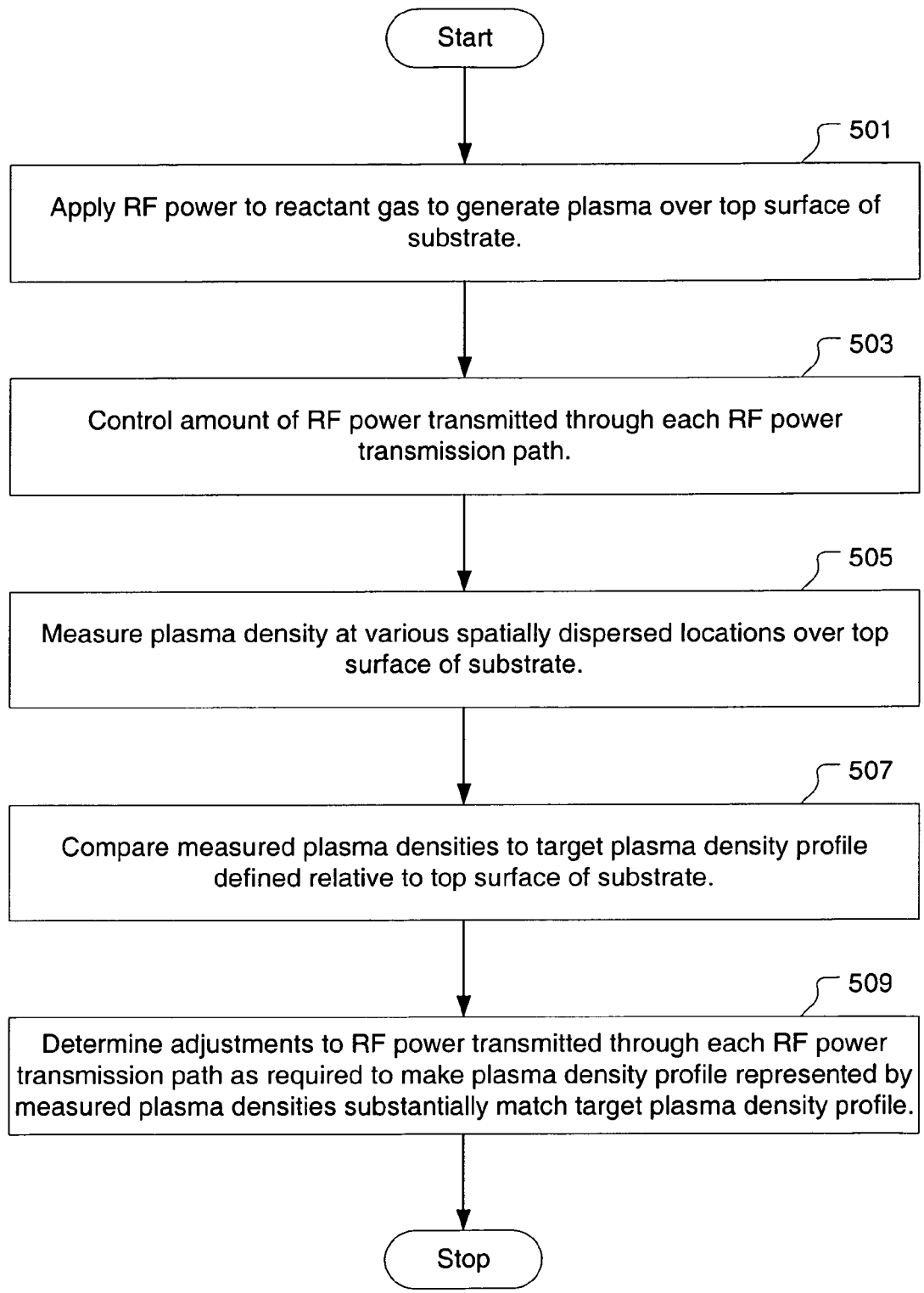
FIG. 5 is an illustration showing a flowchart of a method for controlling a plasma density profile relative to a substrate, in accordance with one embodiment of the present invention.

FIG. 5 is an illustration showing a flowchart of a method for controlling a plasma density profile relative to a substrate, in accordance with one embodiment of the present invention. The method includes an operation 501 for applying RF power to a reactant gas to generate a plasma over a top surface of a substrate. In one embodiment, RF power of multiple frequencies is applied to the reactant gas. For example, a higher frequency RF power can be applied for plasma density generation, and a lower frequency RF power can be applied for bias generation across the substrate.

The method also includes an operation 503 for controlling an amount of RF power transmitted through each of a number of RF power transmission paths, wherein the RF power transmission paths are spatially dispersed throughout the plasma relative to the top surface of the substrate. Controlling the amount of RF power transmitted through a particular RF power transmission path causes a plasma density within a vicinity of the particular RF power transmission path to be proportionally controlled. In the embodiment where RF power of multiple frequencies is applied to the reactant gas, each of the multiple frequencies of RF power is independently controllable through each of the RF power transmission paths. In one embodiment, controlling the amount of RF power transmitted through the various RF power transmission paths is performed by controlling one or more tuning elements within each of the various RF power transmission paths. As previously discussed, each tuning element can be either an adjustable capacitive element or an adjustable inductive element disposed within an RF power transmission path.

The method further includes an operation 505 for measuring a plasma density at various spatially dispersed locations over the top surface of the substrate. In one embodiment, the plasma densities are measured directly. In another embodiment, bias voltages are measured at various dispersed locations across the substrate. The measured bias voltages are correlated to respective plasma densities overlying the top surface of the substrate. In an operation 507, the measured plasma densities are compared to a target plasma density profile defined relative to the top surface of the substrate. An operation 509 is then performed to determine adjustments to the controlled amount of RF power transmitted through each of the RF power transmission paths as required to make a plasma density profile represented by the measured plasma densities substantially match the target plasma density profile. It should be appreciated that controlling the amount of RF power transmitted through each of the RF power transmission paths is performed in an automated manner to maintain a substantial match between the actual plasma density profile and the target plasma density profile.

The RF power transmission tuning elements of the present invention enable control of substrate uniformity in a wide range of processes which vary with process parameters such as power, pressure, and process gases. More specifically, the present invention provides a number of tuning elements within the RF power transmission paths through the plasma to affect a change in plasma density profile overlying the substrate, and hence affect a change in uniformity across the substrate. Also, the plasma density control capability provided by the present invention provides a wider window for process development than what would otherwise be constrained by uniformity concerns. Additionally, through proper plasma monitoring and control of the various tuning elements, process uniformity can be controlled from wafer-to-wafer and tool matching can be made easier.

While this invention has been described in terms of several embodiments, it will be appreciated that those skilled in the art upon reading the preceding specifications and studying the drawings will realize various alterations, additions, permutations, and equivalents thereof. Therefore, it is intended that the present invention includes all such alterations, additions, permutations, and equivalents as fall within the true spirit and scope of the invention.

What is claimed is:

1. A plasma processing system for semiconductor wafer processing, comprising:
    a processing chamber defined by walls that enclose a processing volume, wherein a ground circuit is defined to extend from the walls of processing chamber to a reference ground potential;
    a radiofrequency (RF) power source;
    a matching network connected to the RF power source;
    a transmit electrode disposed within the processing chamber, the transmit electrode connected to the matching network, wherein the transmit electrode is defined to transmit RF power to a plasma to be generated within the processing volume;
    a number of return electrodes disposed within the processing chamber and connected to the reference ground potential;
    a plurality of RF power transmission paths extending from the RF power source through the matching network through the transmit electrode through the plasma to the number of return electrodes; and
    a plurality of tuning elements respectively disposed within the plurality of RF power transmission paths, each of the plurality of tuning elements defined to adjust an amount of RF power to be transmitted through an RF power transmission path within which the tuning element is disposed, a plasma density within a vicinity of a particular RF power transmission path being directly proportional to the amount of RF power transmitted through the particular RF power transmission path during operation of the plasma processing system,
    wherein the plurality of tuning elements includes an adjustable capacitive element defined between the transmit electrode and the ground circuit that extends from the walls of the processing chamber to the reference ground potential, and
    wherein the plurality of tuning elements includes an adjustable inductive element defined within the ground circuit that extends from the walls of the processing chamber to the reference ground potential, and
    wherein the plurality of tuning elements includes a number of adjustable inductive elements defined within an RF power transmission path segment extending from the matching network to the transmit electrode, and
    wherein the plurality of tuning elements includes a number of adjustable capacitive elements defined between the RE power transmission path segment extending from the matching network to the transmit electrode and the reference ground potential.

2. A plasma processing system for semiconductor wafer processing as recited in claim 1, wherein the transmit electrode is a lower electrode upon which a semiconductor wafer is to be supported in exposure to the plasma.

3. A plasma processing system for semiconductor wafer processing as recited in claim 1, wherein the RF power source is defined to generate RF power at multiple fixed frequencies.

4. A plasma processing system for semiconductor wafer processing as recited in claim 1, wherein the number of return electrodes are positioned with respect to the transmit electrode about the processing volume within which the plasma is to be generated such that the plurality of RF power transmission paths are spatially distributed relative to the transmit electrode.

5. A plasma processing system for semiconductor wafer processing as recited in claim 4, further comprising:
    a control system defined to control the plurality of tuning elements to enable control of RF power transmission through the spatially distributed RF power transmission paths such that a particular plasma density profile is established relative to the transmit electrode during operation of the plasma processing system.

6. A plasma processing system for semiconductor wafer processing as recited in claim 5, further comprising:
    metrology defined to acquire a control signal indicative of an existing plasma density profile relative to the transmit electrode, wherein the control system is defined to process the control signal to determine necessary adjustments for the plurality of tuning elements such that the particular plasma density profile is maintained relative to the transmit electrode during operation of the plasma processing system.

7. A system for controlling a plasma density profile relative to a substrate, comprising:

a plasma processing chamber defined by walls enclosing a processing volume within which radiofrequency (RF) power is to be applied to a reactant gas to generate a plasma over a top surface of the substrate, wherein a ground circuit is defined to extend from the walls of the processing chamber to a reference ground potential;

a transmit electrode disposed within the processing chamber;

a plurality of return electrodes disposed within the processing chamber about the processing volume;

an RF power source for generating the RF power;

a matching network for matching an impedance of the RF power to be supplied to the plasma processing chamber;

a plurality of RF power transmission paths extending from the RF power source through the matching network through the transmit electrode through the plasma to the plurality of return electrodes, the amount of RE power transmitted along a particular RF power transmission path directly influencing a plasma density within a vicinity of the particular RF power transmission path;

a plurality of RF power tuning elements respectively disposed within the plurality of RF power transmission paths, each of the plurality of RF power tuning elements capable of adjusting an amount of RF power transmitted along a corresponding one of the plurality of RF power transmission paths; and a computing system defined to receive plasma density profile monitoring signals from the plasma chamber, the computing system further defined to generate and transmit control signals to the plurality of RF power tuning elements to adjust the plasma density within the vicinity of each of the plurality of RF power transmission paths such that a plasma density profile over the top surface of the substrate is maintained in accordance with a target plasma density profile, wherein the plurality of tuning elements includes an adjustable capacitive element defined between the transmit electrode and the ground circuit that extends from the walls of the processing chamber to the reference ground potential, and wherein the plurality of tuning elements includes an adjustable inductive element defined within the ground circuit that extends from the walls of the processing chamber to the reference ground potential, and wherein the plurality of tuning elements includes a number of adjustable inductive elements defined within an RF power transmission path segment extending from the matching network to the transmit electrode, and wherein the plurality of tuning elements includes a number of adjustable capacitive elements defined between the RF power transmission path segment extending from the matching network to the transmit electrode and the reference ground potential.

8. A system for controlling a plasma density profile relative to a substrate as recited in claim 7, further comprising:

metrology defined to directly measure an existing plasma density at various spatially dispersed locations over the top surface of the substrate, the measured plasma densities representing the plasma density profile monitoring signals.

9. A system for controlling a plasma density profile relative to a substrate as recited in claim 7, further comprising:

metrology defined to measure bias voltages at various dispersed locations across the top surface of the substrate, the measured bias voltages representing the plasma density profile monitoring signals, the computing system including a correlation between the measured bias voltages and the plasma density profile relative to the substrate, the computing system defined to use the measured bias voltages and the correlation to determine the plasma density profile relative to the substrate.

10. A system for controlling a plasma density profile relative to a substrate as recited in claim 7, wherein a number of the control signals to be generated and transmitted by the computing system are routed to servos defined to mechanically adjust respective ones of the plurality of RF power tuning elements.

11. A system for controlling a plasma density profile relative to a substrate as recited in claim 7, wherein the transmit electrode is a lower electrode upon which the substrate is to be supported in exposure to the plasma, and each return electrode is connected to a ground potential.

12. A system for controlling a plasma density profile relative to a substrate as recited in claim 7, wherein the number of return electrodes are positioned with respect to the transmit electrode about the processing volume within which the plasma is to be generated such that the plurality of RF power transmission paths are spatially distributed relative to the transmit electrode.

* * * * *